(12) United States Patent
Watkins

(10) Patent No.: US 7,795,737 B2
(45) Date of Patent: Sep. 14, 2010

(54) METHODS OF REDISTRIBUTING BONDPAD LOCATIONS ON AN INTEGRATED CIRCUIT

(75) Inventor: Charles M. Watkins, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 618 days.

(21) Appl. No.: 11/787,148

(22) Filed: Apr. 12, 2007

(65) Prior Publication Data

US 2007/0194458 A1    Aug. 23, 2007

Related U.S. Application Data

(62) Division of application No. 10/903,796, filed on Jul. 29, 2004, now Pat. No. 7,262,121.

(51) Int. Cl.
*H01L 21/44* (2006.01)
*H01L 21/4763* (2006.01)
*H01L 29/40* (2006.01)

(52) U.S. Cl. .................. 257/758; 257/759; 257/760; 438/598; 438/622

(58) Field of Classification Search ............... 257/758, 257/759, 760; 438/598, 622
See application file for complete search history.

(56) References Cited

U.S. PATENT DOCUMENTS

| | | | | |
|---|---|---|---|---|
| 4,763,178 | A * | 8/1988 | Sakui et al. | 257/296 |
| 5,841,193 | A * | 11/1998 | Eichelberger | 257/723 |
| 6,166,440 | A * | 12/2000 | Yang | 257/758 |
| 6,376,903 | B1 | 4/2002 | Kim | |
| 6,396,148 | B1 * | 5/2002 | Eichelberger et al. | 257/758 |
| 6,551,856 | B1 | 4/2003 | Lee | |
| 6,593,649 | B1 | 7/2003 | Lin et al. | |
| 6,617,655 | B1 * | 9/2003 | Estacio et al. | 257/401 |
| 6,664,176 | B2 | 12/2003 | Hedler et al. | |
| 6,687,842 | B1 * | 2/2004 | DiStefano et al. | 713/500 |
| 6,818,544 | B2 * | 11/2004 | Eichelberger et al. | 438/613 |
| 6,841,875 | B2 * | 1/2005 | Ohsumi | 257/738 |
| 6,977,440 | B2 * | 12/2005 | Pflughaupt et al. | 257/777 |
| 7,262,121 | B2 | 8/2007 | Watkins | |
| 7,297,614 | B2 * | 11/2007 | Lee et al. | 438/459 |

(Continued)

OTHER PUBLICATIONS

Blankenhorn et al., *A Semi-Additive Electroless Ni/Au Process Offers a Low-Cost Wafer-Bumping Method*, Chip Scale Review Online, 9 pages (Jul. 2001).

*Primary Examiner*—Matthew C Landau
*Assistant Examiner*—James M Mitchell
(74) *Attorney, Agent, or Firm*—Wells St. John P.S.

(57) ABSTRACT

Integrated circuits and methods of redistributing bondpad locations are disclosed. In one implementation, a method of redistributing a bondpad location of an integrated circuit includes providing an integrated circuit comprising an inner lead bondpad. A first insulative passivation layer is formed over the integrated circuit. A bondpad-redistribution line is formed over the first insulative passivation layer and in electrical connection with the inner lead bondpad through the first insulative passivation layer. The bondpad-redistribution line includes an outer lead bondpad area. A second insulative passivation layer is formed over the integrated circuit and the bondpad-redistribution line. The second insulative passivation layer is formed to have a sidewall outline at least a portion of which is proximate to and conforms to at least a portion of the bondpad-redistribution line. Other aspects and implementations are contemplated.

15 Claims, 13 Drawing Sheets

U.S. PATENT DOCUMENTS

| | | | |
|---|---|---|---|
| 7,307,293 B2 * | 12/2007 | Fjelstad et al. | 257/200 |
| 7,397,117 B2 * | 7/2008 | Lin et al. | 257/700 |
| 2002/0068380 A1 | 6/2002 | Miyazaki et al. | |
| 2002/0072152 A1 | 6/2002 | Urushima | |
| 2003/0098513 A1 | 5/2003 | Huang | |
| 2003/0219969 A1 * | 11/2003 | Saito et al. | 438/622 |
| 2004/0032013 A1 | 2/2004 | Cobbley et al. | |
| 2004/0033673 A1 | 2/2004 | Cobbley et al. | |
| 2004/0036137 A1 | 2/2004 | Gleason et al. | |
| 2004/0040855 A1 | 3/2004 | Batinovich | |
| 2004/0041271 A1 * | 3/2004 | Storli | 257/759 |
| 2004/0104457 A1 | 6/2004 | Tan et al. | |
| 2004/0195687 A1 | 10/2004 | Inoue et al. | |
| 2005/0104228 A1 * | 5/2005 | Rigg et al. | 257/786 |
| 2006/0022350 A1 | 2/2006 | Watkins | |
| 2006/0214309 A1 | 9/2006 | Watkins | |
| 2006/0223298 A1 | 10/2006 | Watkins | |
| 2007/0176292 A1 * | 8/2007 | Chen et al. | 257/750 |
| 2007/0194458 A1 | 8/2007 | Watkins | |
| 2008/0006931 A1 | 1/2008 | Oliver et al. | |
| 2008/0036067 A1 | 2/2008 | Lin | |
| 2008/0061411 A1 | 3/2008 | Shen et al. | |
| 2008/0061412 A1 | 3/2008 | Shen et al. | |
| 2008/0061421 A1 | 3/2008 | Shen et al. | |
| 2008/0099892 A1 | 5/2008 | Chen et al. | |
| 2008/0099896 A1 | 5/2008 | Shen et al. | |
| 2009/0014858 A1 * | 1/2009 | Boon et al. | 257/686 |

* cited by examiner

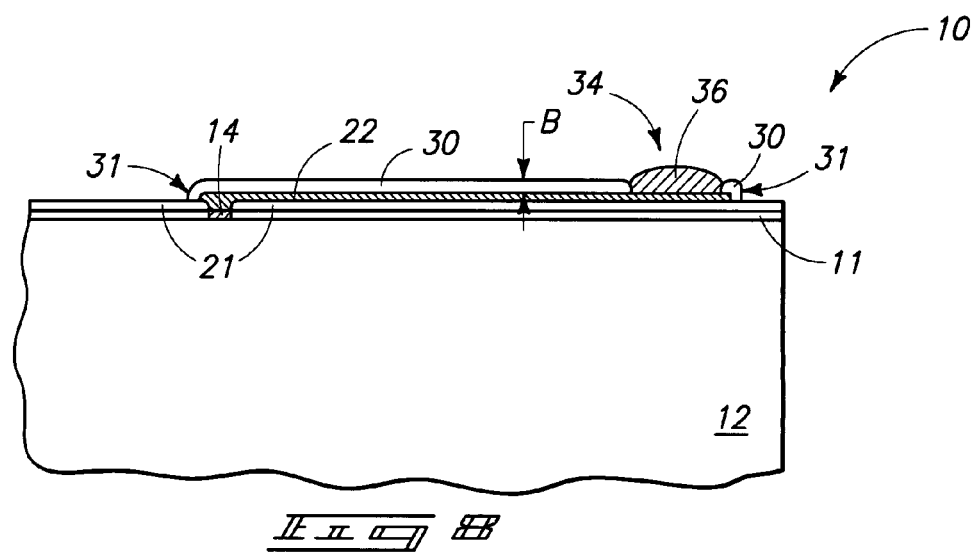
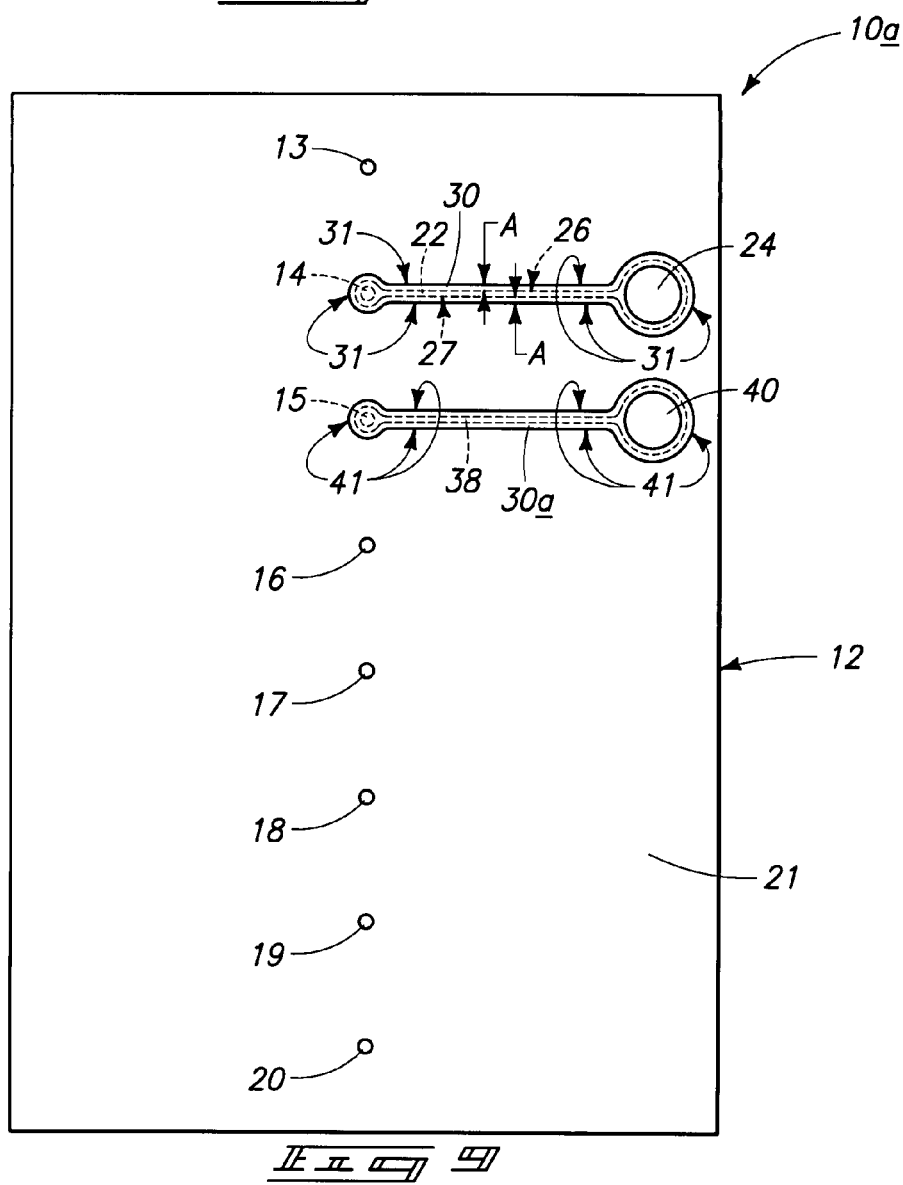

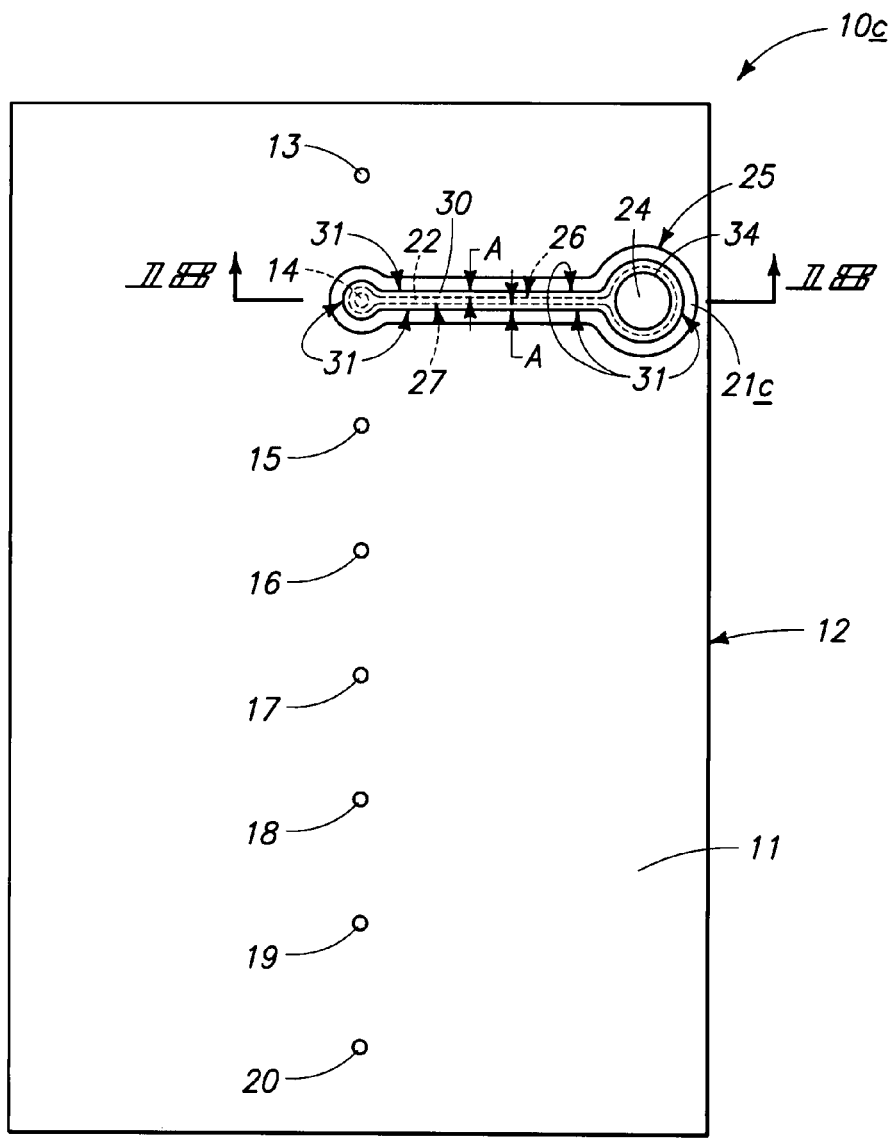
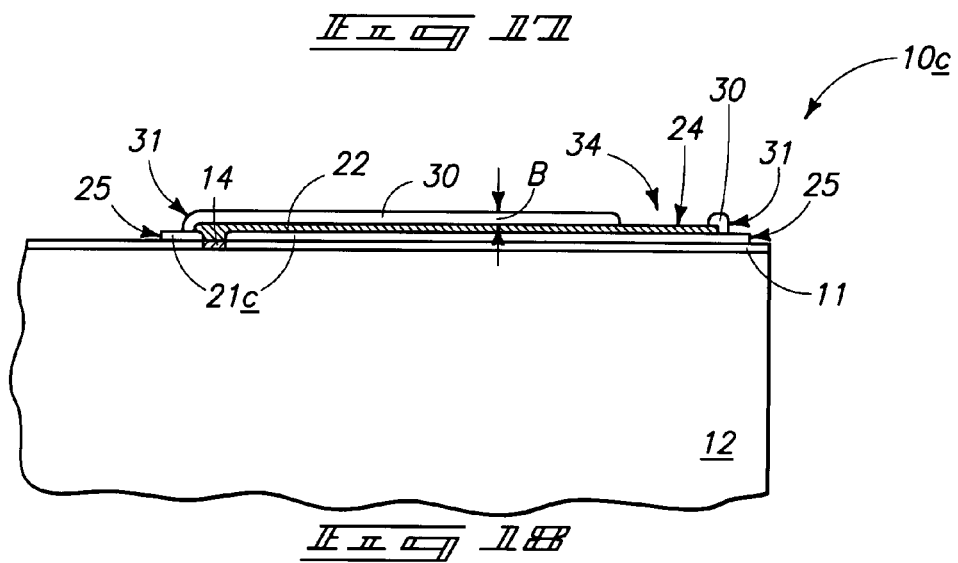

METHODS OF REDISTRIBUTING BONDPAD LOCATIONS ON AN INTEGRATED CIRCUIT

RELATED PATENT DATA

This patent resulted from a divisional application of U.S. patent application Ser. No. 10/903,796, filed Jul. 29, 2004, now U.S. Pat. No. 7,262,121 entitled "Integrated Circuit and Methods of Redistributing Bondpad Locations", naming Charles M. Watkins as Inventor, the disclosure of which is incorporated by reference.

TECHNICAL FIELD

This invention relates to integrated circuits and to methods of redistributing bondpad locations.

BACKGROUND OF THE INVENTION

Integrated circuits are typically comprised of individual dies or chips. A plurality of such is typically fabricated on a single substrate commonly referred to as a wafer. At the conclusion of fabrication at the wafer level, the chips/dies are singulated from the substrate typically by cutting or sawing. The individual chips are then frequently packaged and attached to other chips or other electronic structures such as a printed circuit board. The packaging and/or attachment of the chip might be accomplished by a wire bonding process, a flip-chip attachment process, or some other process. Further, wafer scale integration has been proposed whereby the integrated circuit or circuits are encompassed in a single wafer that is not singulated into individual die or chips.

Regardless, integrated circuit design typically forms bonding pads at varying locations at the outermost portion of the integrated circuit. Such locations might be grouped centrally relative to the substrate within which the integrated circuit is fabricated, grouped peripherally, or a grouped in a combination of peripherally and centrally. However, it is often desirable to have the bondpads in a different pattern, in a different size, and/or at different locations atop the chip/substrate. This requirement has lead to what is known as redistribution wherein the bondpad connection points of an integrated circuit originally at one location on the chip are redistributed to other locations. The initially located bondpads are typically referred to as inner lead bondpads. Redistribution lines are fabricated to extend from the inner lead bondpads to what are referred to as outer lead bondpads where wire bonding, solder ball or other conductive connection occurs to other devices or structures. Inner lead bondpads typically have their outermost surfaces received elevationally inward as compared to those of outer lead bondpads. Further in many instances, the inner lead bondpads are received radially inward compared to the outer lead bondpads.

The redistribution lines are typically formed over an insulative passivation material, for example polyimide. The redistribution lines are subsequently globally covered by another polyimide or other insulative passivation layer. Unfortunately, the thermal expansion coefficients of the passivation layers in comparison to other materials of the underlying substrate can be quite different. This can cause undesirable lateral displacement of the outer passivation layer from the redistribution lines and/or cracking of one or more passivation layers during processing which conventionally includes heating and cooling of the substrate.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention includes integrated circuits and methods of redistributing bondpad locations. In one implementation, a method of redistributing a bondpad location of an integrated circuit includes providing an integrated circuit comprising an inner lead bondpad. A first insulative passivation layer is formed over the integrated circuit. A bondpad-redistribution line is formed over the first insulative passivation layer and in electrical connection with the inner lead bondpad through the first insulative passivation layer. The bondpad-redistribution line includes an outer lead bondpad area. A second insulative passivation layer is formed over the integrated circuit and the bondpad-redistribution line. The second insulative passivation layer is formed to have a sidewall outline at least a portion of which is proximate to and conforms to at least a portion of the bondpad-redistribution line.

In one implementation, a method of redistributing bondpad locations of an integrated circuit includes providing an integrated circuit comprising a plurality of inner lead bondpads. An insulative passivation layer is formed over the integrated circuit. First and second bondpad-redistribution lines are formed over the insulative passivation layer. The first bondpad-redistribution line is formed to be in electrical connection with one of the inner lead bondpads through the insulative passivation layer. The second bondpad-redistribution line is formed to be in electrical connection with another of the inner lead bondpads through the insulative passivation layer, with the second bondpad-redistribution line elevationally overlapping and being insulated from the first bondpad-redistribution line.

In one implementation, an integrated circuit includes a plurality of inner lead bondpads. A passivation layer is received over the integrated circuit. First and second bondpad-redistribution lines are received over the insulative passivation layer. The first bondpad-redistribution line is in electrical connection with one of the inner lead bondpads through the insulative passivation layer. The second bondpad-redistribution line is in electrical connection with another of the inner lead bondpads through the insulative passivation layer. The second bondpad-redistribution line elevationally overlaps and is insulated from the first bondpad-redistribution line.

Other aspects and implementations are contemplated.

BRIEF DESCRIPTION OF THE DRAWINGS

Preferred embodiments of the invention are described below with reference to the following accompanying drawings.

FIG. 8 is a view of the FIG. 7 substrate at a processing step subsequent to that depicted by FIG. 7.

FIG. 9 is a diagrammatic top plan view of an integrated circuit substrate processed in accordance with an aspect of the invention.

FIG. 17 is a view of the FIG. 15 substrate at a processing step subsequent to that depicted by FIG. 15.

FIG. 18 is an enlarged cross sectional view taken through line 18-18 in FIG. 17.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
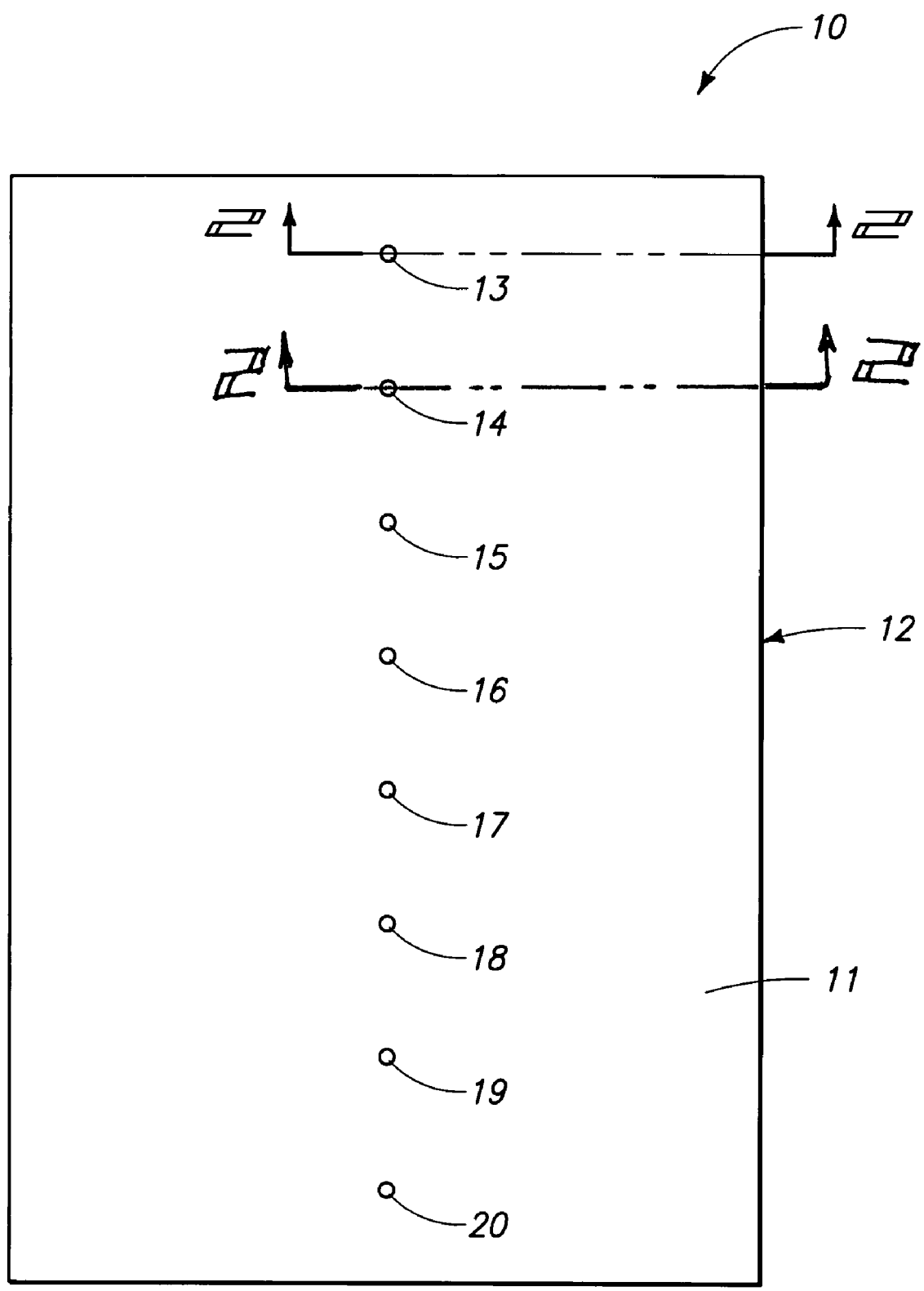
FIG. 1 is a diagrammatic top plan view of an integrated circuit substrate in process in accordance with an aspect of the invention.
Figure 2:
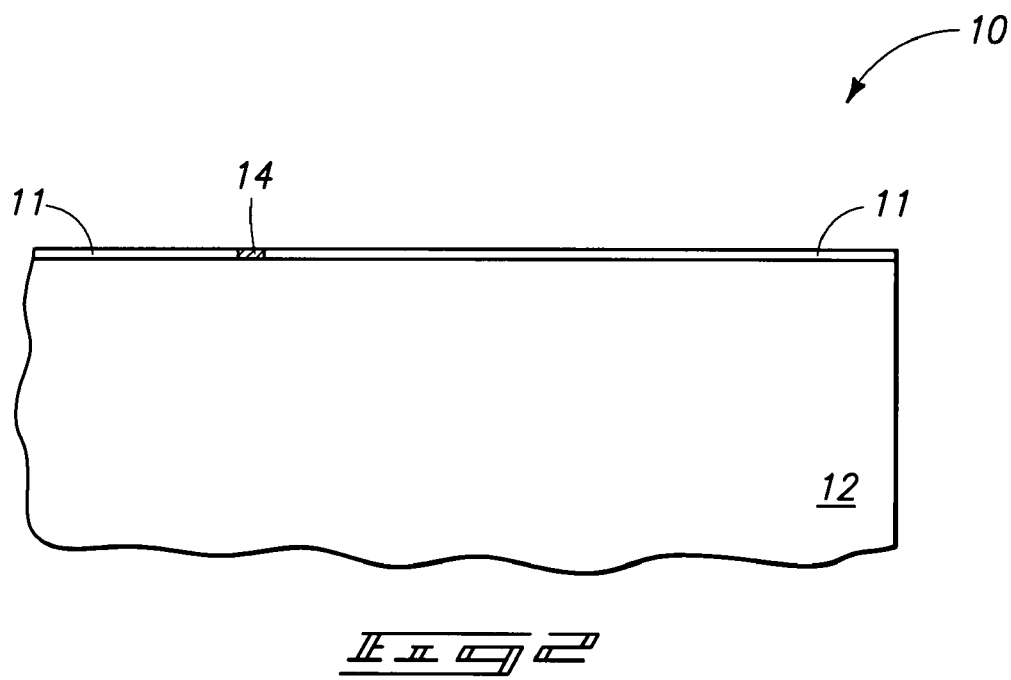
FIG. 2 is an enlarged cross sectional view taken through line 2-2 in FIG. 1.

By way of example only, a first embodiment method of redistributing a bondpad location of an integrated circuit is described with reference to FIGS. 1-8. Referring initially to FIGS. 1 and 2, a semiconductor substrate is indicated generally with reference numeral 10. In the context of this document, the term "semiconductor substrate" or "semiconductive substrate" is defined to mean any construction comprising semiconductive material, including, but not limited to, bulk semiconductive materials-such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Semiconductor substrate 10 is depicted, by way of example only, as comprising a chip which would typically be part of a larger substrate (not shown) containing a plurality of such chips, such as a semiconductor wafer, prior to singulation and after initial bondpads have been formed. However, the invention contemplates methods and circuitry associated with wafer-scale or other integration in addition to chip or die singulation, and whether existing or yet-to-be developed. Substrate 10 can be considered as having some portion 12 within which some suitable integrated circuit has been fabricated. By way of example only, such might include one or more of processor circuitry, logic circuitry, memory circuitry and others. Integrated circuitry 12 is depicted as comprising some passivation layer 11 within which a series of inner lead bondpads 13, 14, 15, 16, 17, 18, 19 and 20 are received. More or fewer inner lead bondpads might of course be provided, and as well be positioned elsewhere over the surface of substrate 10. The description proceeds of a method of redistributing bondpad location 14 of the integrated circuit, with redistribution of other bondpad locations also of course likely occurring over the substrate at the same time.

Figure 3:
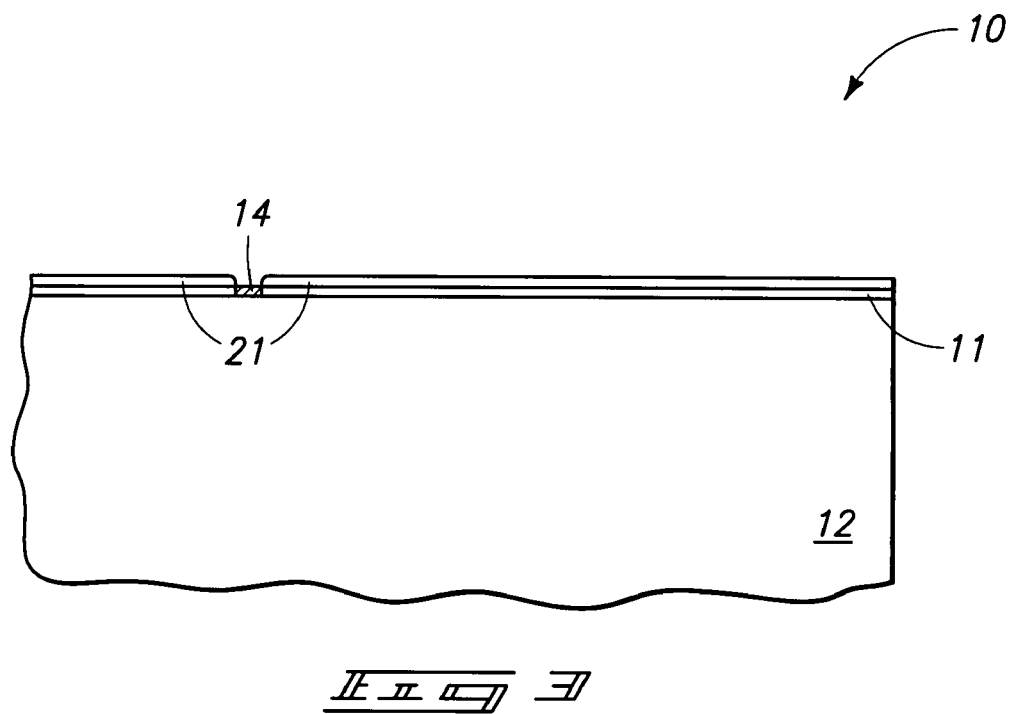
FIG. 3 is a view of the FIG. 2 substrate at a processing step subsequent to that depicted by FIG. 2.

Referring to FIG. 3 a first insulative passivation layer 21 has been formed over integrated circuit 12. By way of example only, an exemplary material is a polymer, for example a photoimageable polymer, and further for example a photoimageable polyimide. Example photoimageable polymers include CRC-7561 (PBO-polybenzoxazole) available from Sumitomo Bakelite Company of Tokyo, Japan, and BCB (benzocyclobutene) available from Dow Chemical Company of Midland, Mich. In one preferred embodiment, first insulative passivation layer 21 is formed over the depicted inner lead bondpads, including bondpad 14, and is then photopatterned to outwardly expose at least a portion of at least some of the respective inner lead bondpads. An exemplary preferred thickness range for first insulative passivation layer 21 is from 2 microns to 12 microns.

Figure 4:
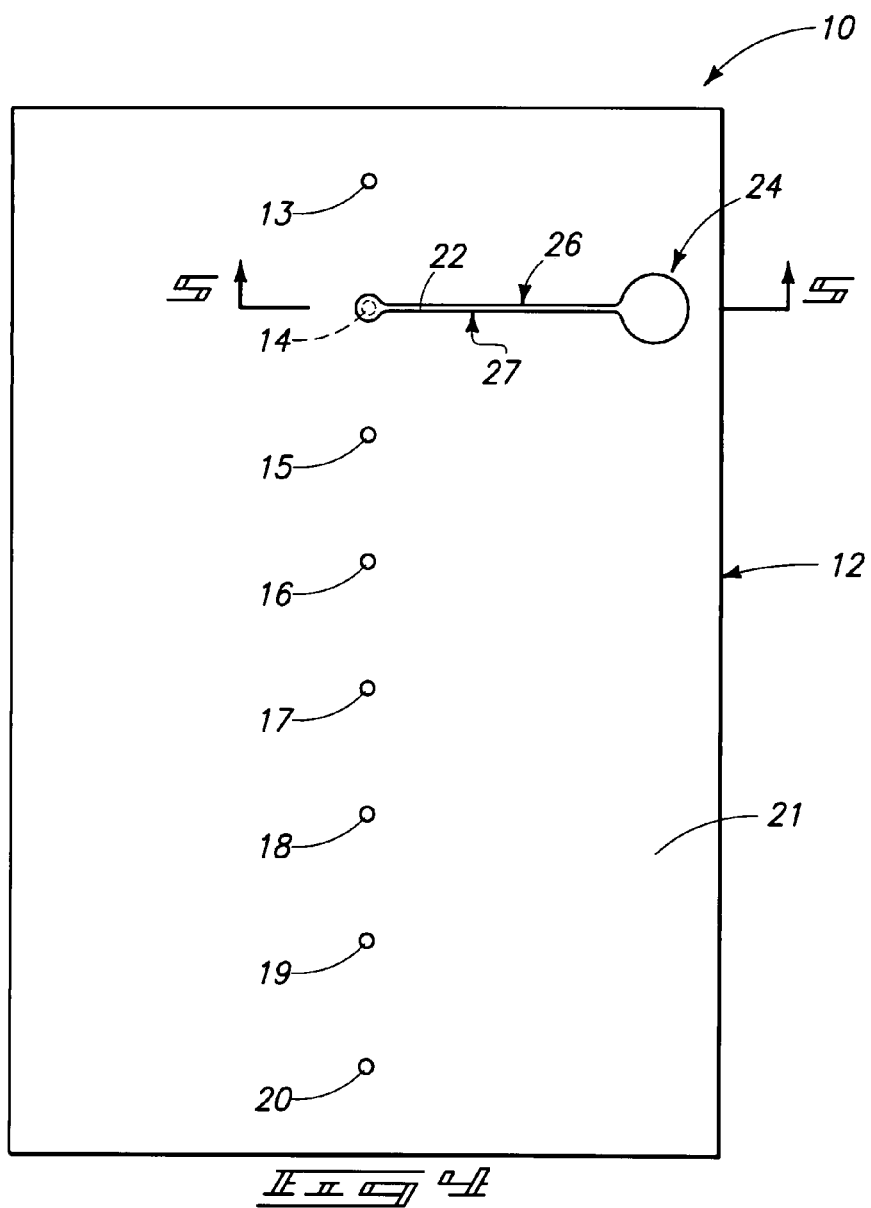
FIG. 4 is a view of the FIG. 1 substrate at a processing step subsequent to that depicted by FIG. 1.
Figure 5:
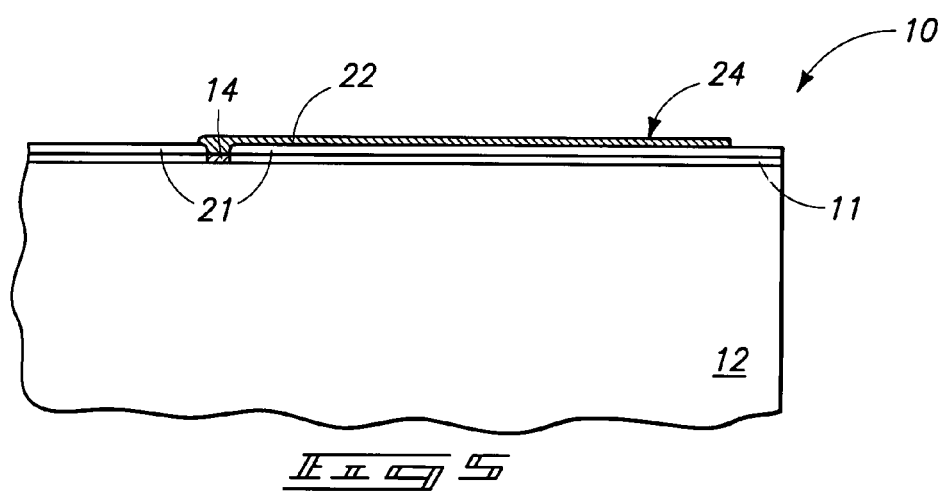
FIG. 5 is an enlarged cross sectional view taken through line 5-5 in FIG. 4.

Referring to FIGS. 4 and 5, a bondpad-redistribution line 22 has been formed over first insulative passivation layer 21, and in electrical connection with inner lead bondpad 14 through first insulative passivation layer 21. Bondpad-redistribution line 22 comprises some outer lead bondpad area 24. One preferred method of forming bondpad-redistribution line 22 comprises depositing a conductive layer, and then subtractively etching such conductive layer. Exemplary preferred materials include elemental metals, alloys of elemental metals, and conductive metal compounds. In one preferred embodiment, at least a majority of bondpad-redistribution line 22 comprises at least one of an elemental metal and a conductive metal compound. Further by way of example only, preferred elemental metals are copper and aluminum. An exemplary preferred thickness range for redistribution line 22 is from 0.2 micron to 5 microns. For purposes of the continuing discussion, bondpad-redistribution line 22 can be considered as having opposing sidewalls 26 and 27.

Figure 6:
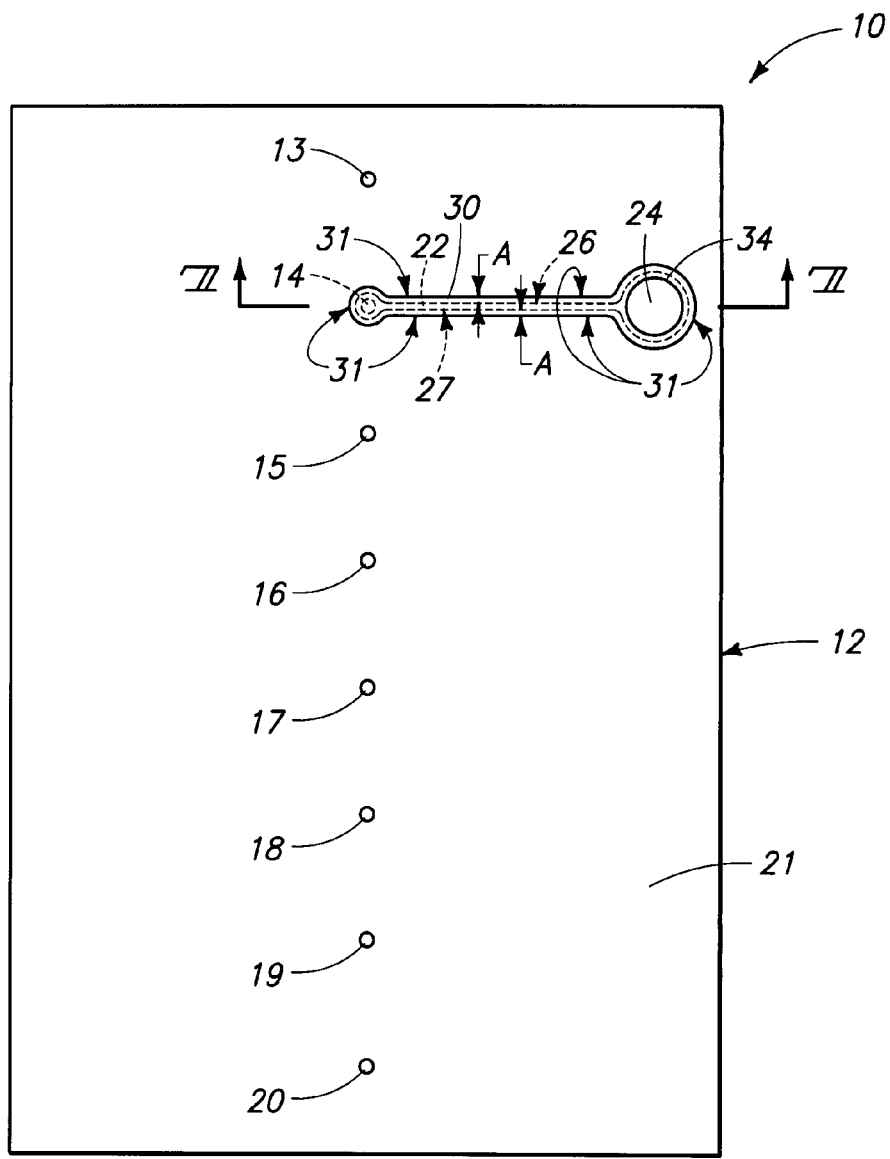
FIG. 6 is a view of the FIG. 4 substrate at a processing step subsequent to that depicted by FIG. 4.
Figure 7:
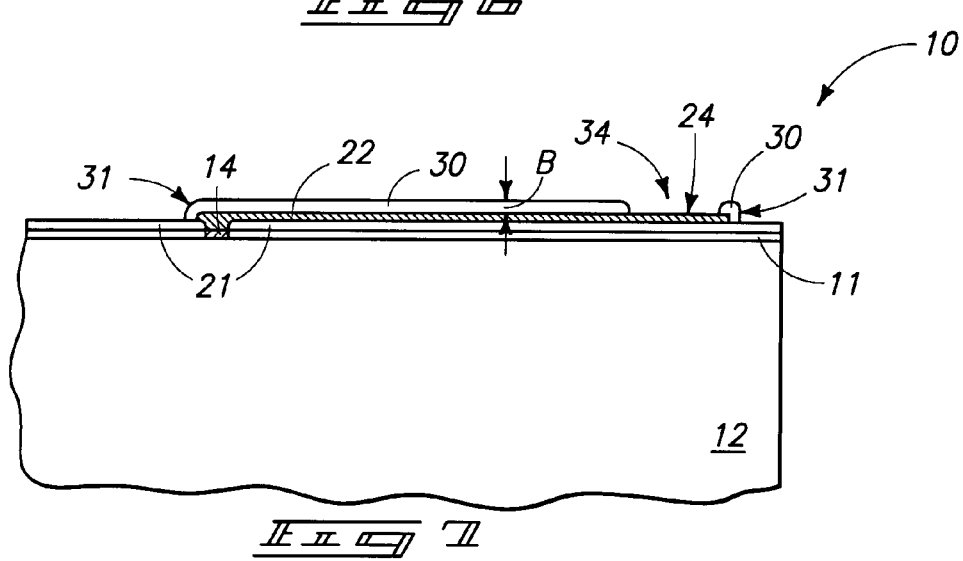
FIG. 7 is an enlarged cross sectional view taken through line 7-7 in FIG. 6.

Referring to FIGS. 6 and 7, a second or covering insulative passivation layer 30 has been formed over integrated circuit 12 and bondpad-redistribution line 22. Such second insulative passivation layer 30 has been formed to have a sidewall outline 31 at least a portion of which is proximate to and conforms to at least a portion of bondpad-redistribution line 22. In the depicted preferred embodiment, second insulative passivation layer 30 is formed "on" (meaning in contact with) bondpad-redistribution line 22. By way of example only, an exemplary preferred second insulative passivation layer material comprises a polymer, for example a photoimageable polymer, and further for example a photoimageable polyimide. Further and regardless, in one preferred embodiment the first and second insulative passivation layers are of the same composition, although different compositions are also of course contemplated. A preferred manner of forming sidewall outline 31 is by depositing the second insulative passivation layer followed by subtractive etching of it, for example using photopatterning, and further for example utilizing photoresist if the polymer is not photoimageable and preferably using photoresist if the polymer is not photoimageable. In, one preferred embodiment, sidewall outline 31 defines a lateral thickness "A" of second insulative passivation layer 30 from each of bondpad-redistribution line sidewalls 26 and 27 which is no greater than 20 microns, and in another preferred embodiment which is no greater than 10 microns. Further by way of example only, a preferred lower end range lateral thickness "A" is 2 microns. An exemplary preferred elevational thickness "B" for second insulative passivation layer 30 is from 2 microns to 12 microns.

In one preferred embodiment, second insulative passivation layer 30 is formed to have at least a majority portion of sidewall outline 31 conforming to at least a majority portion of bondpad-redistribution line 22, with in the illustrated preferred embodiment second insulative passivation layer 22 having been formed to have all of sidewall outline 31 conforming to all of bondpad-redistribution line 22. Further and regardless in the depicted preferred embodiment, a contact opening 34 has been formed through second insulative passivation layer 30 to outer lead bondpad area 24. An opening (not shown) might also be formed elsewhere over line 22, for example over inner lead bondpad 14, for providing a probe/test contact location.

FIG. 8 depicts further processing comprising forming an underbump metal 36 within contact opening 34 in electrical connection with outer lead bondpad area 24. By way of example only, exemplary underbump metal materials include nickel or copper (including combination thereof), and which preferably includes a gold cap. An exemplary thickness is 10 microns.

The invention contemplates methods of redistributing a bondpad location of an integrated circuit, and which also includes methods of redistributing bondpad locations of an integrated circuit. By way of example only, redistribution of bondpad locations is depicted in FIG. 9. Like numerals from the first described embodiment have been utilized where appropriate, with differences or additions being indicated with the suffix "a" or with different numerals. FIG. 9 depicts a substrate 10a wherein first insulative passivation layer 21 has been formed over an integrated circuit comprising a plurality of inner lead bondpads 13, 14, 15, 16, 17, 18, 19 and 20. A plurality of bondpad-redistribution lines has been formed over first insulative passivation layer 21. Two such lines 22 and 38 are depicted, with of course fabrication of more and/or other shaped bondpad-redistribution lines being contemplated. Respective of the bondpad-redistribution lines are in electrical connection with at least one of the inner lead bondpads through the first insulative passivation layer, with the respective bondpad-redistribution lines comprising a respective outer lead bondpad area. In the depicted exemplary embodiment, the respective of the bondpad-redistribution lines are in electrical connection with different ones of the inner lead bondpads through the first insulative passivation layer. For example, the depicted additional bondpad-redistribution line 38 is in electrical connection with inner lead bondpad 15 through first insulative passivation layer 21. Further, bondpad-redistribution line 38 is depicted as comprising an outer lead bondpad area 40.

A second insulative passivation layer 30, 30a has been formed over the integrated circuit and the plurality of bondpad-redistribution lines 22 and 38. Second insulative passivation layer 30, 30a has been formed to have a plurality of sidewall outlines 31, 41. Further, at least a portion of the respective sidewall outlines 31, 41 is proximate to and conforms to at least a portion of individual bondpad-redistribution lines 22, 38, respectively. Other attributes are preferably as described above in connection with the first described embodiment.

Figure 10:
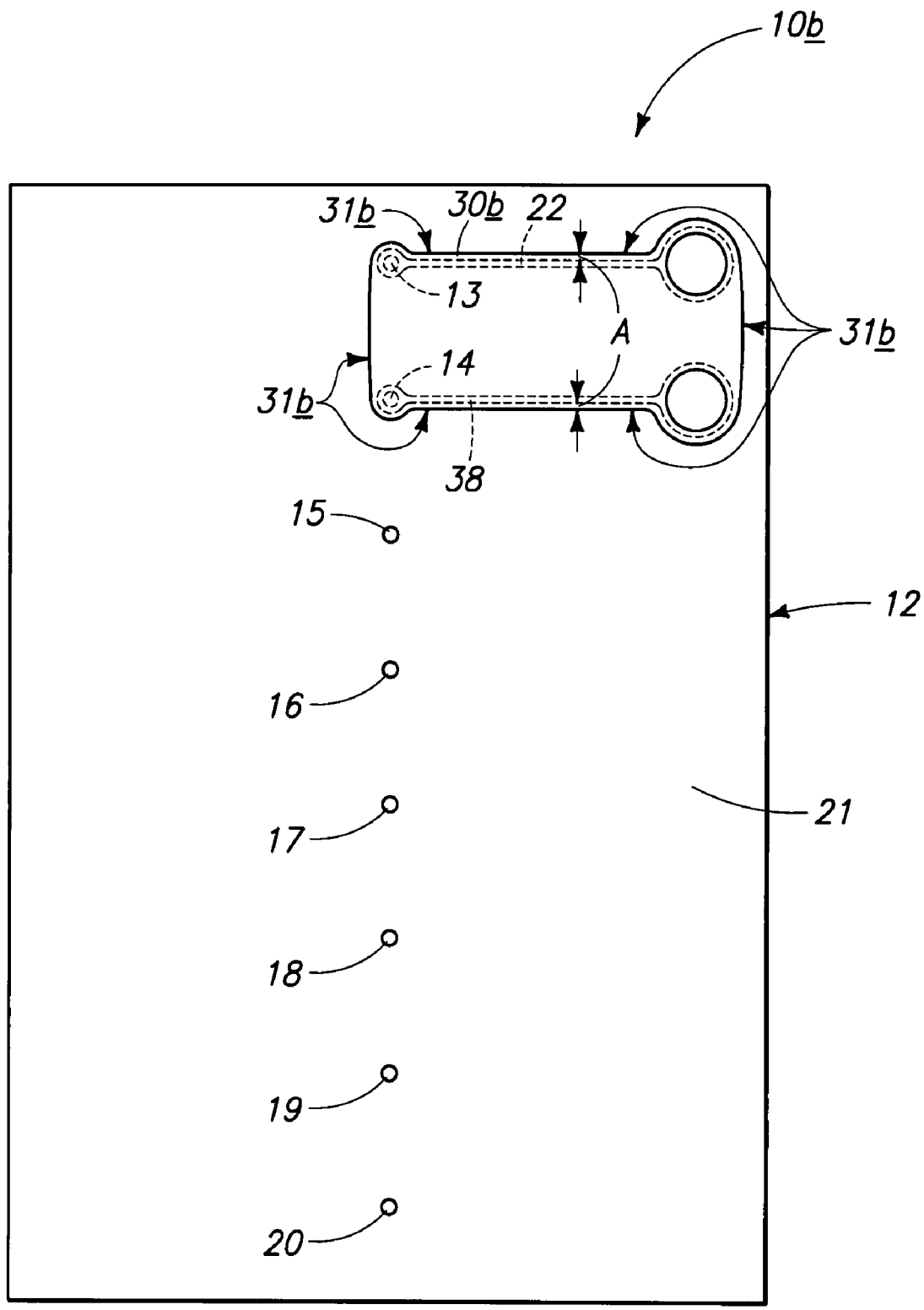
FIG. 10 is a diagrammatic top plan view of an integrated circuit substrate processed in accordance with an aspect of the invention.

FIG. 10 depicts an alternate embodiment 10b. Like numerals to that of the second described embodiment are utilized where appropriate, with differences being indicated with different numerals or with the suffix "b". By way of example only, the first and second described embodiments depict the second insulative passivation layer as being formed to have all of sidewall outlines 31 and 41 conforming to all of their respective bondpad-redistribution lines. The invention also contemplates the second insulative passivation layer being formed to have only a portion of the sidewall outline conforming to only a portion of a bondpad-redistribution line. For example and by way of example only, the depicted FIGS. 6 and 9 embodiments might be fabricated to be received along at least a portion of only one of the bondpad-redistribution line opposing line sidewalls, or further by way of example along the entirety of only one of the bondpad-redistribution line opposing sidewalls. Further by way of example only, FIG. 10 depicts an inventive embodiment whereby the second insulative passivation layer sidewall outline encompasses at least two bondpad-redistribution lines. For example, the depicted bondpad-redistribution lines 22 and 38 are encompassed by second insulative sidewall passivation layer 30b having sidewall outline 31b. Of course, more than two bondpad-redistribution lines might be encompassed by a second insulative passivation layer sidewall outline (i.e., 3, 4 or more), with however single redistribution line encapsulation being more preferred.

Figure 11:
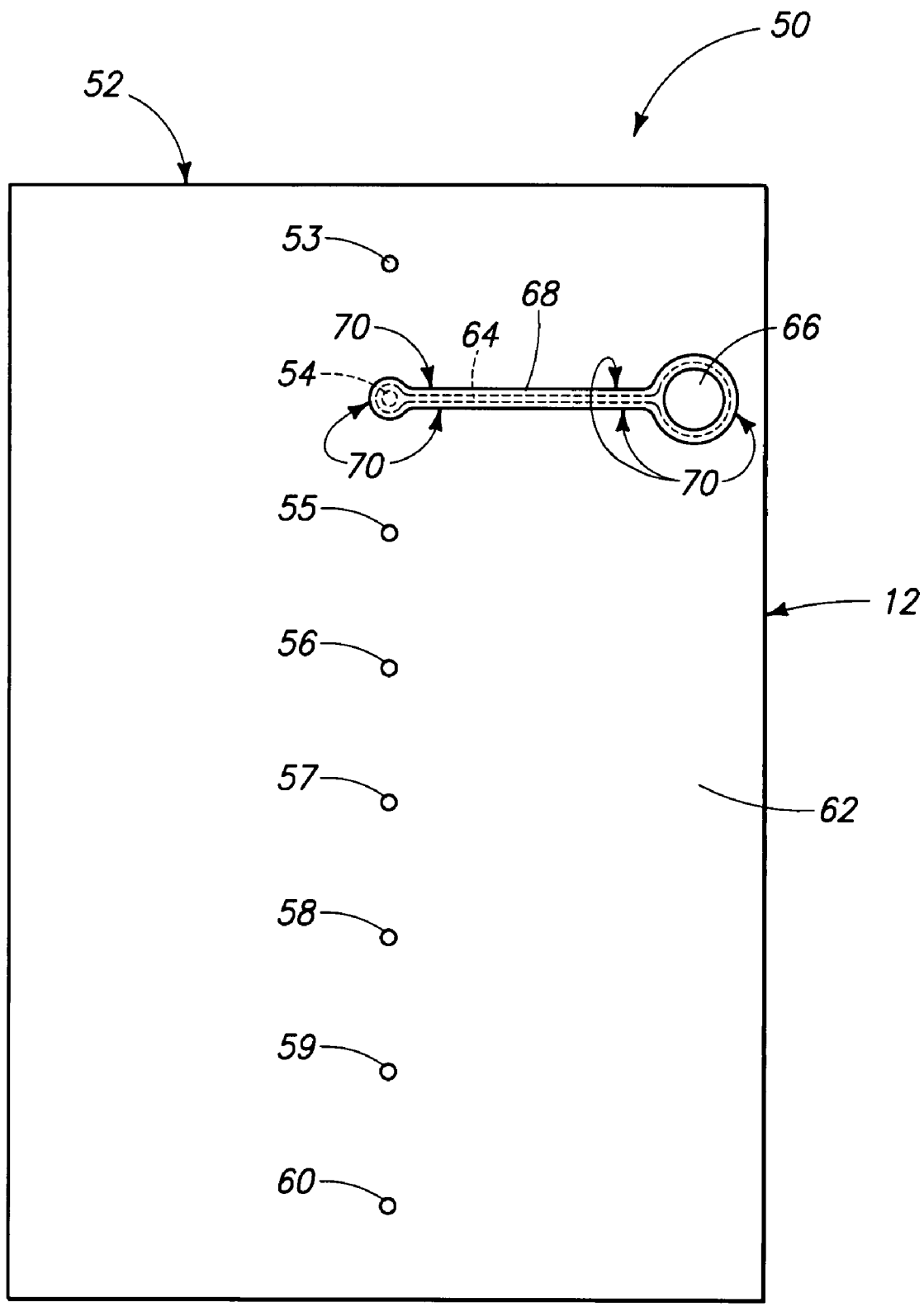
FIG. 11 is a diagrammatic top plan view of an integrated circuit substrate in process in accordance with an aspect of the invention.

Implementations of methods of redistributing bondpad locations of an integrated circuit are also described with reference to FIGS. 11-14. Referring initially to FIG. 11, such depicts an exemplary semiconductor substrate 50 comprising an integrated circuit 52. A first insulative passivation layer 62 has been formed over integrated circuit 52. Preferred attributes of the same are as described above with respect to first insulative passivation layer 21. Integrated circuit 52 comprises a series of inner lead bondpads 53, 54, 55, 56, 57, 58, 59 and 60. For purposes of the continuing discussion, inner lead bondpads 54 and 53 are referred to as first and second inner lead bondpads, respectively.

A first bondpad-redistribution line 64 has been formed over first insulative passivation layer 62 in electrical connection with first inner lead bondpad 54 through first insulative passivation layer 62. First bondpad-redistribution line 64 comprises a first outer lead bondpad area 66. Preferred attributes are otherwise as described above in connection with bondpad-redistribution line 22. A second or covering insulative passivation layer 68 has been formed over integrated circuit 52 and first bondpad-redistribution line 64. Such has been formed to have a sidewall outline 70 at least a portion of which is proximate to and conforms to at least a portion of first bondpad-redistribution line 64. Preferred attributes are otherwise as described above in connection with passivation layer 30.

Figure 12:
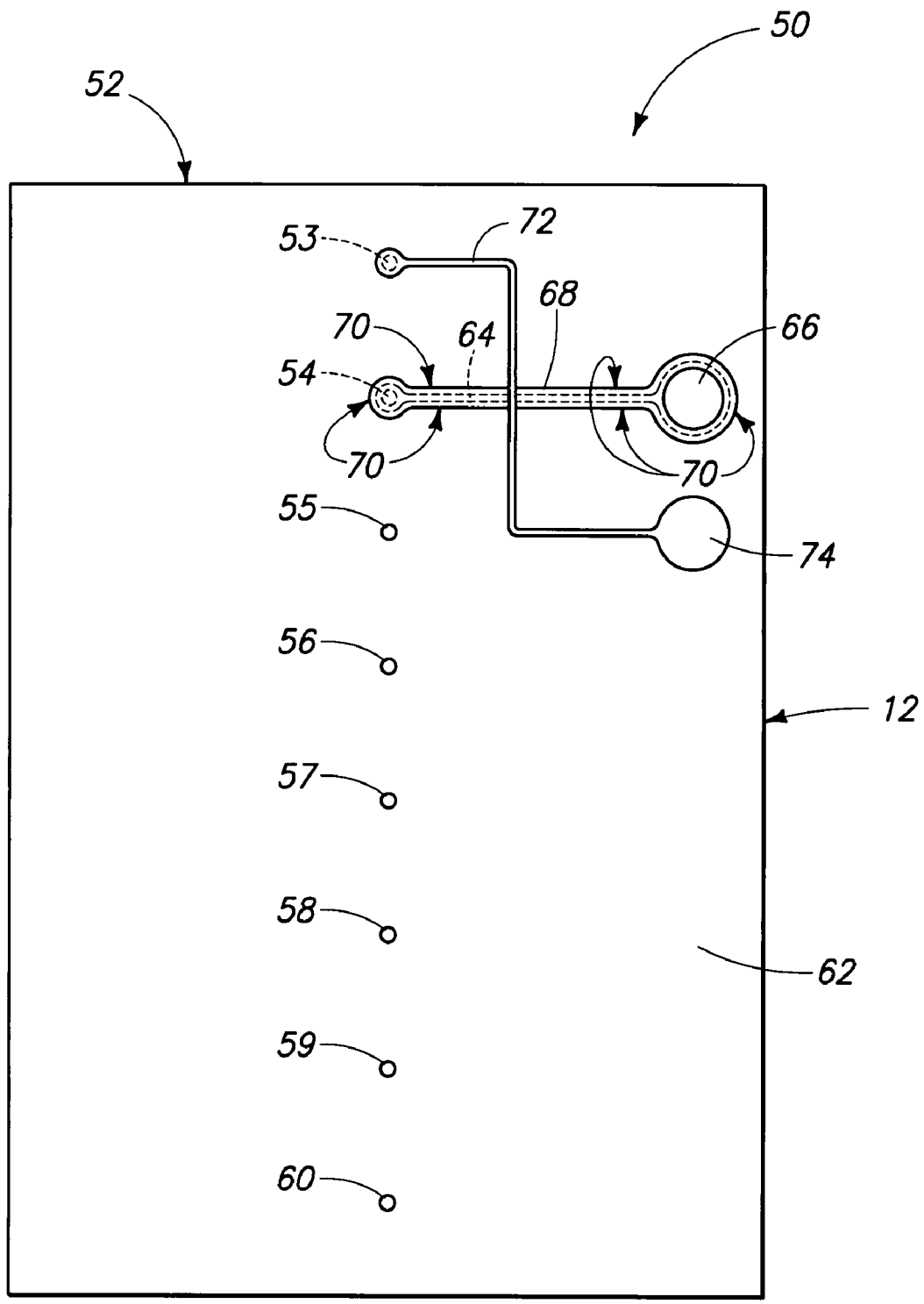
FIG. 12 is a view of the FIG. 11 substrate at a processing step subsequent to that depicted by FIG. 11.

Referring to FIG. 12, a second bondpad-redistribution line 72 has been formed over first insulative passivation layer 62 in electrical connection with second inner lead bondpad 53 through first insulative passivation layer 62. Second bondpad-redistribution line 72 comprises a second outer lead bondpad area 74. At least a portion of second bondpad-redistribution line 72 is received over second insulative passivation layer 68 outline 70, and over first bondpad-redistribution line 64. Preferred attributes of second bondpad-redistribution line 72 are otherwise as described above in connection with first bondpad-redistribution line 64 and bondpad-redistribution line 22 of the first described embodiment. In the depicted and preferred embodiment, second bondpad-redistribution line 72 crosses first bondpad-redistribution line 64 at a right angle to first bondpad-redistribution line 64.

Figure 13:
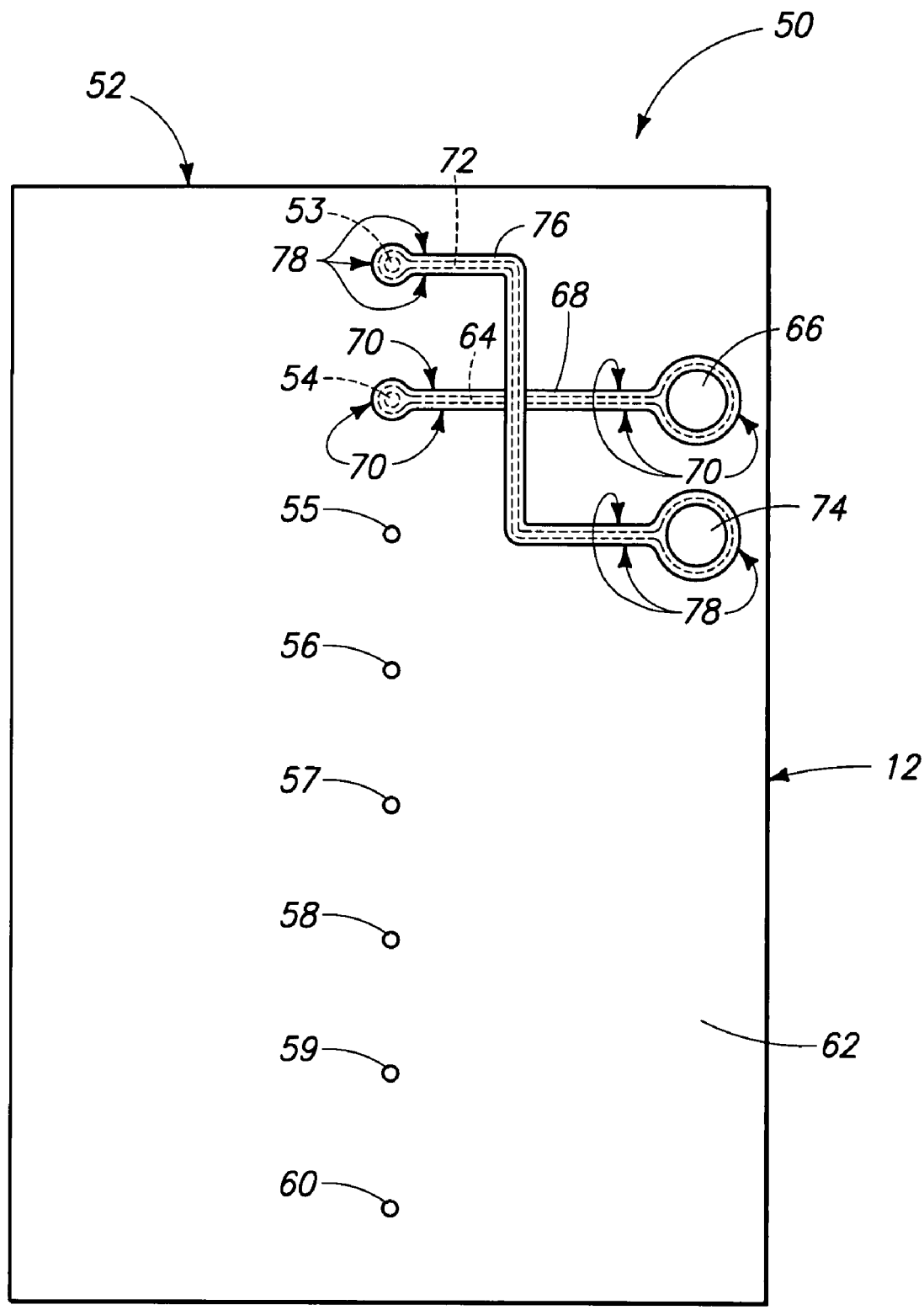
FIG. 13 is a view of the FIG. 12 substrate at a processing step subsequent to that depicted by FIG. 12.

Referring to FIG. 13, a third or covering insulative passivation layer 76 has been formed over integrated circuit 52 and second bondpad-redistribution line 72. Third insulative passivation layer 76 has been formed to have a sidewall outline 78 at least a portion of which is proximate to and conforms to at least a portion of second bondpad-redistribution line 72. Further, at least a portion of third insulative passivation layer 76 outline 78 is received over second insulative passivation layer outline 70 and over first bondpad-redistribution line 64. Preferred attributes for third insulative passivation layer 76 are otherwise as described above in connection with second insulative passivation layer 68. Of course, additional redistribution lines would typically be fabricated in connection with those depicted by FIG. 13, and further, additional separate redistribution line layers might be fabricated.

Figure 14:
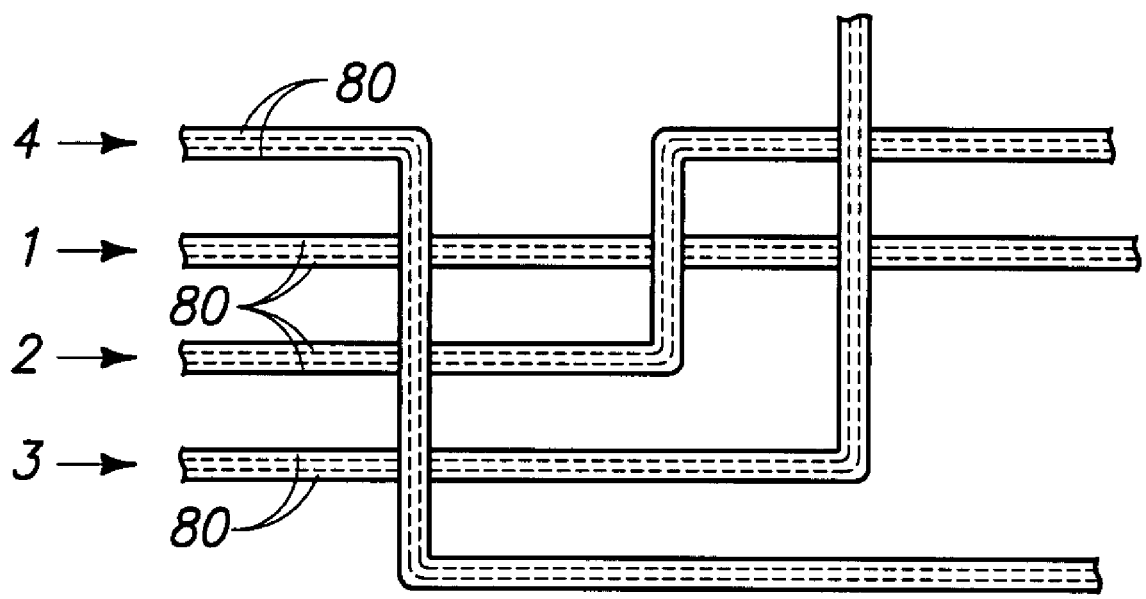
FIG. 14 is a diagrammatic top plan view of a portion of an integrated circuit substrate in accordance with an aspect of the invention.

Further for example and by way of example only, FIG. 14 diagramatically depicts a series of redistribution lines 1, 2, 3 and 4 which are respectively coated with insulative passivation layers 80. The depicted numerals 1, 2, 3 and 4 provide exemplary multi-level processing depicting and also indicating separate in-time sequence when the depicted lines with their associated passivation layers were formed. Accordingly, any number of redistribution line layers can be fabricated, with in the depicted preferred embodiment the overall stack height never being more than two insulated redistribution lines high.

The invention contemplates an implementation of a method of redistributing bondpad locations of an integrated circuit independent of the above-described preferred attributes. In such implementation, such a method includes providing an integrated circuit comprising a plurality of inner lead bondpads. An insulative passivation layer is formed over the integrated circuit. Preferred attributes are as described above with respect to the integrated circuit, inner lead bondpads and insulative passivation layer. First and second bondpad-redistribution lines are formed over the insulative passivation layer. The first bondpad-redistribution line is received in electrical connection with one of the inner lead bondpads through the insulative passivation layer, and the second bondpad-redistribution line is received in electrical connection with another of the inner lead bondpads through the insulative passivation layer. The second bondpad-redistribution line elevationally overlaps and is insulated from the first bondpad-redistribution line.

Such implementation also contemplates a third bondpad-redistribution line formed over the insulative passivation layer after forming the second bondpad-redistribution line. The third bondpad-redistribution line can be in electrical connection with yet another of the inner lead bondpads through the insulative passivation layer. The third bondpad-redistribution line can elevationally overlap and be insulated from both the first and second bondpad-redistribution lines. The invention of course contemplates a fourth, and additional, bondpad-redistribution lines fabricated as described above with respect to the second and third bondpad-redistribution lines. In one preferred embodiment, a passivation layer is formed over the first redistribution line, with such insulative passivation layer being formed to have a sidewall outline at least a portion of which is proximate to and conforms to at least a portion of the first bondpad-redistribution line. In one preferred embodiment, subsequent passivation layers are formed over other elevation redistribution lines, and formed to have respective sidewall outlines at least a portion of which are proximate to and conform to at least a portion of the respective bondpad-redistribution lines. However, global and/or other interlevel isolation between redistribution lines are also contemplated in this aspect of the invention.

The invention also contemplates an integrated circuit independent of method of fabrication. Such an integrated circuit comprises a plurality of inner lead bondpads. A passivation layer is received over the integrated circuit. First and second bondpad-redistribution lines are received over the insulative passivation layer. The first bondpad-redistribution line is in electrical connection with one of the inner lead bondpads through the insulative passivation layer. The second bondpad-redistribution line is in electrical connection with another of the inner lead bondpads through the insulative passivation layer. The second bondpad-redistribution line elevationally overlaps and is insulated from the first bondpad-redistribution line. Preferred attributes with respect to such components are otherwise as described above and preferably with respect to the last preferred methodical implementation, and as claimed.

Figure 15:
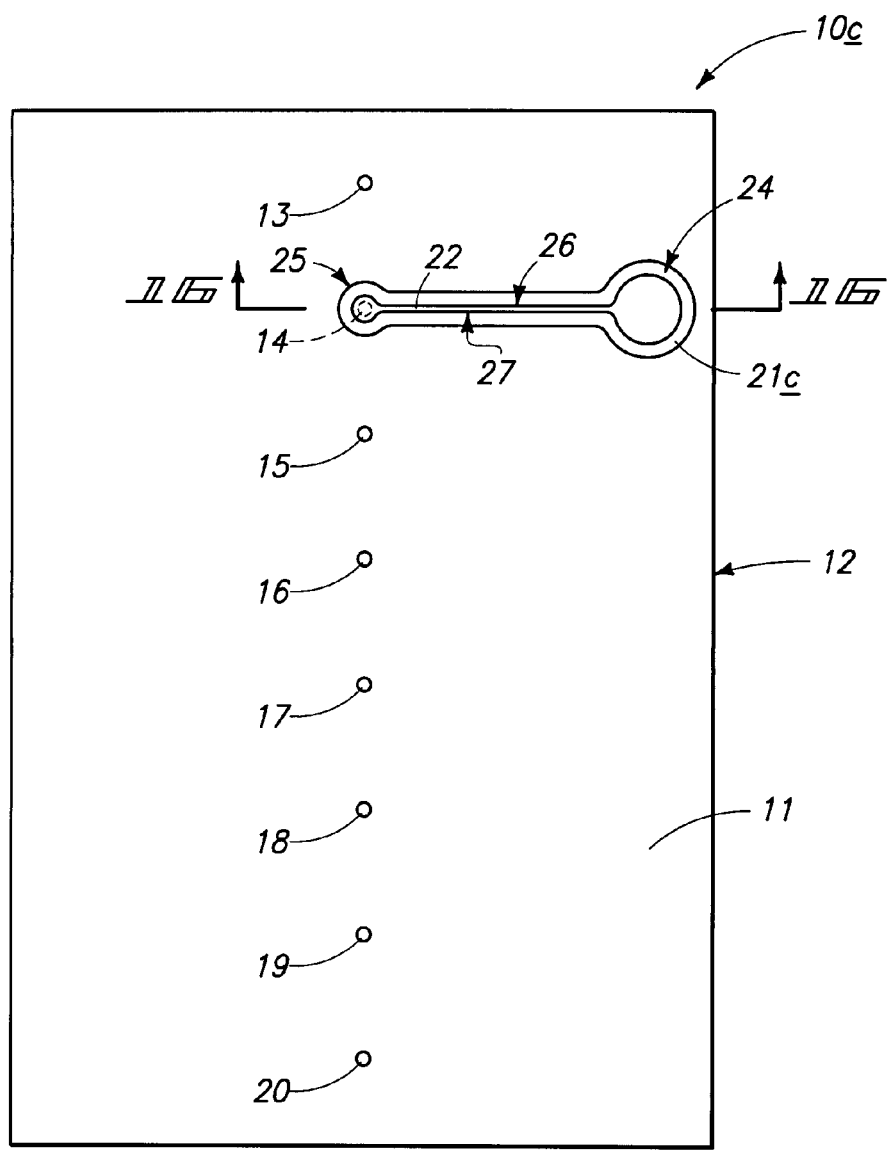
FIG. 15 is a diagrammatic top plan view of an integrated circuit substrate in process in accordance with an aspect of the invention.
Figure 16:
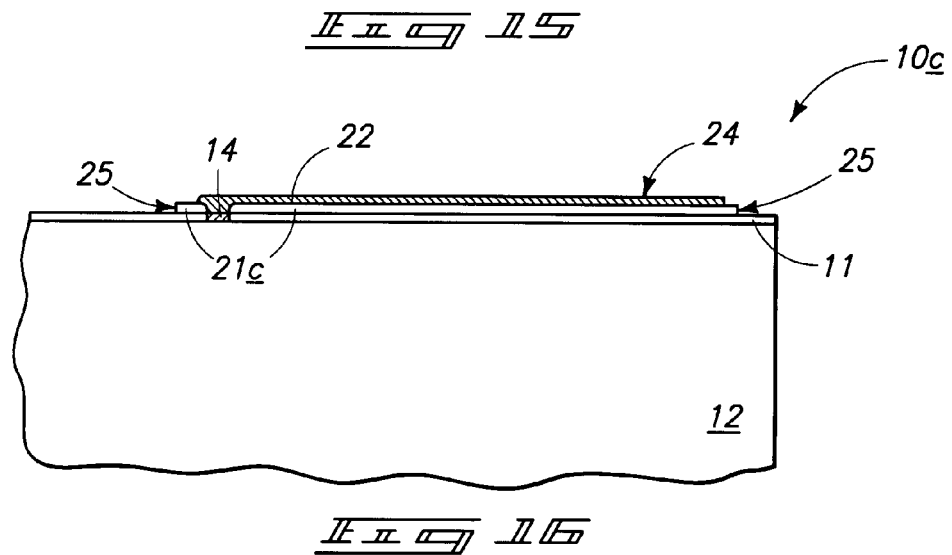
FIG. 16 is an enlarged cross sectional view taken through line 16-16 in FIG. 15.

An aspect of the invention is next described with reference to FIGS. 15-18 with respect to a semiconductor substrate fragment 10c. Like numerals from the first described embodiment have been utilized where appropriate, with differences or additions being indicated with the suffix "c" or with different numerals. FIGS. 15 and 16 depict first insulative passivation layer 21c as having been formed to have a sidewall outline 25 at least a portion of which is proximate to and conforms to at least a portion of bondpad-redistribution line 22. An exemplary preferred process for doing so comprises photolithography and etch, for example either before or after formation of bondpad-redistribution line 22. FIGS. 17-18 depict fabrication of second insulative passivation layer 30 and its associated outline 31. First insulative passivation layer outline 25 might be formed either before or after formation of second insulative passivation layer outline 31. Further and regardless, at least a portion of outline 25 might be formed to be received laterally outward, laterally inward, and/or to coincide with at least a portion of outline 31, with laterally outward receipt being preferred and depicted.

Figure 19:
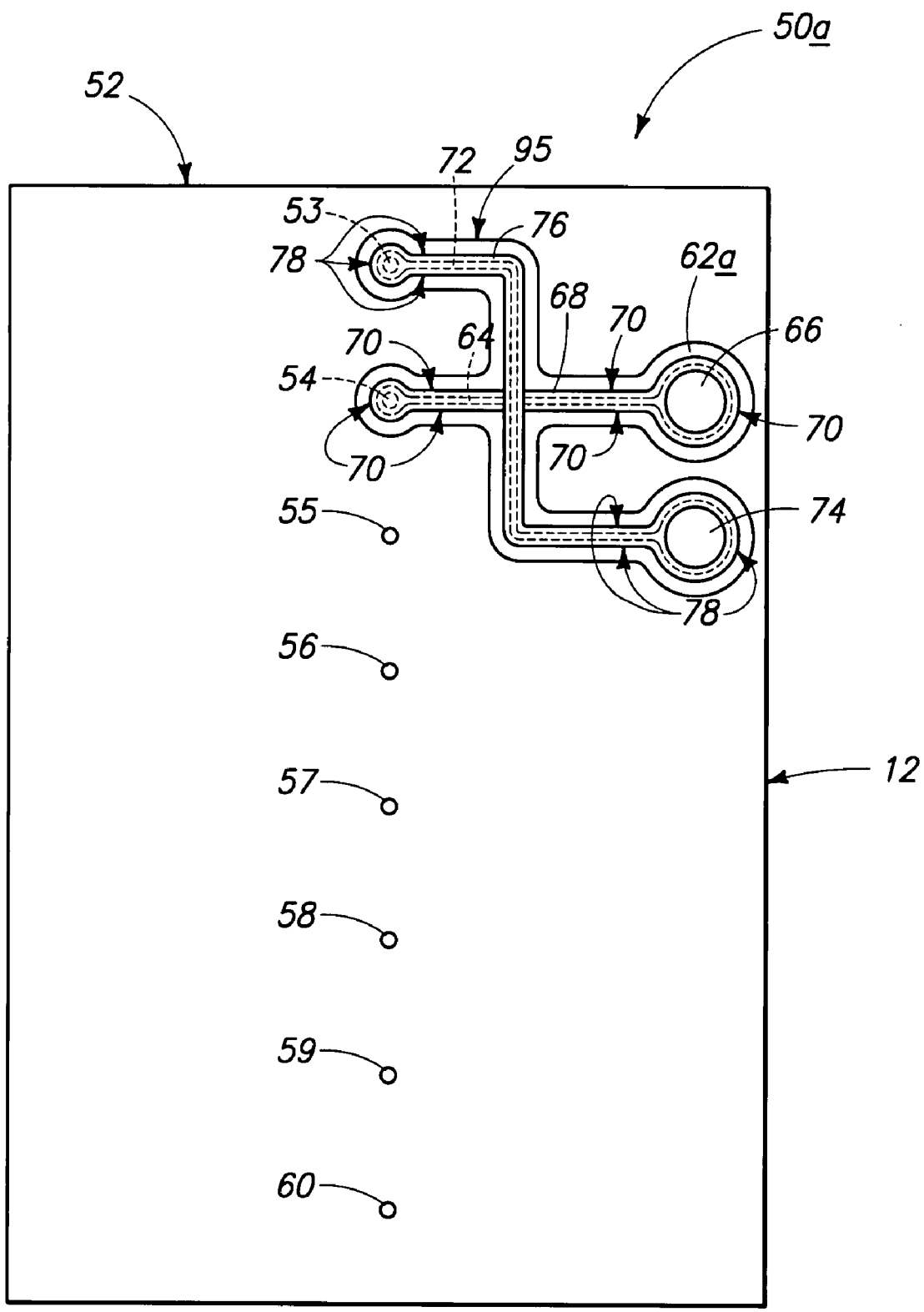
FIG. 19 is a diagrammatic top plan view of an integrated circuit substrate in process in accordance with an aspect of the invention.

Aspects of the FIG. 15-18 implementation can also of course be applied to that of the exemplary FIG. 10, FIGS. 11-13 and FIG. 14 embodiments. For example and by way of example only, FIG. 19 depicts a semiconductor substrate fragment 50a. Like numerals from that of the FIGS. 11-13 embodiment have been utilized where appropriate, with differences or additions being indicated with the suffix "a" or with different numerals. FIG. 19 corresponds to that of FIG. 13, and wherein first insulative passivation layer 62a has been formed to have a sidewall outline 95 at least a portion of which is proximate to and conforms to at least a portion of each of the first and second bondpad-redistribution lines. Preferred attributes as to outline positioning and timing in forming sidewall outline 95 are as described above in connection with the FIGS. 15-18 embodiment.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. An integrated circuit comprising:
   a plurality of inner lead bondpads;
   an insulative passivation layer received over the integrated circuit; and
   first and second bondpad-redistribution lines received over the insulative passivation layer, the first bondpad-redistribution line being in electrical connection with one of the inner lead bondpads through the insulative passivation layer, the second bondpad-redistribution line being in electrical connection with another of the inner lead bondpads through the insulative passivation layer, the second bondpad-redistribution line elevationally overlapping the first bondpad-redistribution line and being insulated from the first bondpad-redistribution line, the second bondpad-redistribution line crossing the first bondpad-redistribution line at a right angle to the first bondpad-redistribution line where such cross.

2. The integrated circuit of claim 1 wherein the insulative passivation layer comprises a polymer.

3. The integrated circuit of claim 2 wherein the polymer is photoimageable.

4. The integrated circuit of claim 3 wherein the polymer comprises polyimide.

5. The integrated circuit of claim 1 wherein both of the first and second bond-pad redistribution lines have a respective covering insulative passivation layer received thereover, the covering insulative passivation layer having a plurality of sidewall outlines, at least a portion of the respective sidewall outlines being proximate to and conforming to at least a portion of individual of said first and second bondpad-redistribution lines.

6. The integrated circuit of claim 1 comprising a third bondpad-redistribution line received over the insulative passivation layer, the third bondpad-redistribution line being in electrical connection with yet another of the inner lead bondpads through the insulative passivation layer, the third bondpad-redistribution line elevationally overlapping at least one of the first and second bondpad-redistribution lines and being insulated from said at least one of the first and second bondpad-redistribution lines.

7. The integrated circuit of claim 6 wherein the third bondpad-redistribution line does not elevationally overlap said one of the first and second bondpad-redistribution line at any location where the second bondpad-redistribution line elevationally overlaps the first bond-pad redistribution line.

8. An integrated circuit comprising:
   a plurality of inner lead bondpads;
   a insulative passivation layer received over the integrated circuit; and
   first and second bondpad-redistribution lines received over the insulative passivation layer, the first bondpad-redistribution line being in electrical connection with one of the inner lead bondpads through the insulative passivation layer, the second bondpad-redistribution line being in electrical connection with another of the inner lead bondpads through the insulative passivation layer, the first and second bondpad-redistribution lines each having a respective sidewall outline, the second bondpad-redistribution line elevationally overlapping the first bondpad-redistribution line and being insulated from the first bondpad-redistribution line, at least one of the first and second bond-pad redistribution lines having a covering insulative passivation layer received thereover, the covering insulative passivation layer having a sidewall outline at least a portion of which is proximate to and laterally spaced from at least a portion of the sidewall outline of said one of the first and second bondpad-redistribution lines, said portion of the sidewall outline of the covering insulative passivation layer conforming to the sidewall outline of said portion of said one of the first and second bondpad-redistribution lines.

9. The integrated circuit of claim 8 wherein the covering insulative passivation layer is formed to have only a portion of its sidewall outline conform to only a portion of the sidewall outline of said one of the first and second bondpad-redistribution lines.

10. The integrated circuit of claim 8 wherein the covering insulative passivation layer is formed to have at least a majority portion of its sidewall outline conform to at least a majority portion of the sidewall outline of said one of the first and second bondpad-redistribution lines.

11. The integrated circuit of claim 10 wherein the covering insulative passivation layer is formed to have all of its sidewall outline conform to all of the sidewall outline of said one of the first and second bondpad-redistribution lines.

12. The integrated circuit of claim 8 wherein said one of the first and second bondpad-redistribution lines comprises opposing sidewalls, the sidewall outline defining a lateral thickness of the covering insulative passivation layer from each of said sidewalls which is no greater than 20 microns.

13. The integrated circuit of claim 12 wherein the sidewall outline of the covering insulative passivation layer defines a lateral thickness of the covering insulative passivation layer from each of said opposing sidewalls which is no greater than 10 microns.

14. The integrated circuit of claim 12 wherein the covering insulative passivation layer is formed to have all of its sidewall outline conform to all of the sidewall outline of said one of the first and second bondpad-redistribution lines.

15. An integrated circuit comprising:
   an integrated circuit chip having a perimeter, the integrated circuit chip comprising a plurality of inner lead bondpads received laterally within the perimeter;
   an insulative passivation layer received on the integrated circuit chip laterally within the perimeter; and
   first and second bondpad-redistribution lines received over the insulative passivation layer on the integrated circuit chip and entirely laterally within the perimeter, the first bondpad-redistribution line being in electrical connection with one of the inner lead bondpads through the insulative passivation layer, the second bondpad-redistribution line being in electrical connection with another of the inner lead bondpads through the insulative passivation layer, the second bondpad-redistribution line elevationally overlapping the first bondpad-redistribution line and being insulated from the first bondpad-redistribution line.

* * * * *